United States Patent [19]

Kobayashi et al.

[11] Patent Number: 4,840,922
[45] Date of Patent: Jun. 20, 1989

[54] METHOD OF MANUFACTURING MASKED SEMICONDUCTOR LASER

[75] Inventors: Hiroshi Kobayashi, 3-15 Hanakoganei, Kodaira-shi, Tokyo; Haruhiko Machida, 10-7 Nakaochiai 4-chome, Shinjuku-ku, Tokyo; Hideaki Ema, Shizuoka; Jun Akedo, Tokyo; Makoto Harigaya, Yokohama; Yasushi Ide, Tokyo, all of Japan

[73] Assignees: Ricoh Company, Ltd.; Hiroshi Kobayashi; Haruhiko Machida, all of Tokyo, Japan

[21] Appl. No.: 80,389

[22] Filed: Oct. 13, 1987

[30] Foreign Application Priority Data

Jul. 29, 1986 [JP] Japan .................................. 61-178140
Mar. 12, 1987 [JP] Japan .................................. 62-057784
Jul. 3, 1987 [JP] Japan .................................. 62-166617

[51] Int. Cl.$^4$ ............................................... H01S 3/19
[52] U.S. Cl. ..................... 437/129; 148/DIG. 71; 148/DIG. 93; 148/DIG. 95; 148/DIG. 106; 156/644; 357/17; 372/49; 372/103; 437/133; 437/905; 437/935; 437/936; 437/962
[58] Field of Search ............... 148/DIG. 71, 65, 72, 148/81, 93, 94, 99, 95, 102, 106, 169; 156/643, 644; 357/17, 18; 427/43.1, 53.1, 55; 372/49, 103; 437/126, 127, 129, 133, 173, 905, 935, 936, 962, 984

[56] References Cited

U.S. PATENT DOCUMENTS

| | | | |
|---|---|---|---|
| 3,849,738 | 11/1974 | Hakki | 372/49 |
| 3,866,238 | 2/1975 | Monroe | 372/49 |
| 4,001,719 | 1/1977 | Krupka | 357/18 |
| 4,100,508 | 7/1978 | Wittke | 357/18 |
| 4,178,564 | 12/1979 | Ladang et al. | 372/49 |
| 4,317,086 | 2/1982 | Scifres et al. | 357/17 |
| 4,337,443 | 6/1982 | Umeda et al. | 357/17 |
| 4,653,059 | 3/1987 | Akiba | 372/96 |
| 4,656,638 | 4/1987 | Tihanyi et al. | 372/49 |

FOREIGN PATENT DOCUMENTS

| | | | |
|---|---|---|---|
| 0090135 | 10/1983 | European Pat. Off. | 372/49 |
| 0089890 | 5/1983 | Japan | 437/129 |
| 0211292 | 11/1984 | Japan | 372/49 |
| 0009189 | 1/1985 | Japan | 372/49 |
| 0214578 | 10/1985 | Japan | 357/17 |
| 0140190 | 6/1986 | Japan | 372/49 |

OTHER PUBLICATIONS

Ettenberg, "A New Dielectric Facet Reflector for Semiconductor Lasers," *Appl. Phys. Lett.*, vol. 32, No. 11, 1 Jun. 1978, pp. 724–725.

Primary Examiner—Olik Chaudhuri
Assistant Examiner—William Bunch
Attorney, Agent, or Firm—Oblon, Spivak, McClelland, Maier & Neustadt

[57] ABSTRACT

A masking layer is formed on the light-emitting mirror surface of a semiconductor laser body. The masking layer is capable of blocking or cutting off light emitted from the semiconductor laser body and of being made optically transparent by exposure to the light emitted from the semiconductor laser body dependent on the amount of energy of the emitted light. When the light is emitted from the semiconductor laser body on which the masking layer is deposited, a small light-emitting hole is defined in the masking layer, the light-emitting hole having a desired diameter commensurate with the amount of energy of the emitted light which is applied to the masking layer.

36 Claims, 1 Drawing Sheet

METHOD OF MANUFACTURING MASKED SEMICONDUCTOR LASER

BACKGROUND OF THE INVENTION

The present invention relates to a method of manufacturing a masked semiconductor laser.

Recording of information at high packing density has been made possible in recent years by optical memories and magnetooptic memories. Technical trends, however, are toward recording and reproducing of information at higher packing density. For reading recorded information from pits which are 0.4 to 0.5 micron across on an optical disk, it is necessary to reduce the diameter of a reading light beam to that range. However, presently available semiconductor lasers emit a light beam which has a longer diameter ranging from 3 to 6 microns and a shorter diameter ranging from 1 to 2 microns, for example, at the light-emitting spot. This size of the light-emitting spot makes it difficult to reduce the beam diameter to a level smaller than the wavelength of the laser beam, e.g., about 0.8 micron.

SUMMARY OF THE INVENTION

It is an object of the present invention to provide a method of manufacturing a masked semiconductor laser serving as a light source for recording and reproducing information at high density, by forming a masking means integral with the semiconductor laser and defining a minute hole in the masking means to obtain a very small light-emitting spot.

To achieve the above object, a light-emitting hole is defined in the masking means by a light beam generated by a semiconductor laser body itself. If a masking material with a light-emitting hole defined therein were combined with a semiconductor laser by an external means, it would be necessary to align the light-emitting hole with an area of the semiconductor laser where the intensity of the emitted laser beam would be highest. With the method of the present invention, however, the light-emitting hole is automatically aligned with the axis of the laser beam, i.e., the area of the semiconductor laser body which emits the highest-intensity laser beam, and the light-emitting hole, which is very small in diameter, can easily be formed in the masking means.

The above and other objects, features and advantages of the present invention will become more apparent from the following description when taken in conjunction with the accompanying drawings in which preferred embodiments of the present invention are shown by way of illustrative example.

DESCRIPTION

A semiconductor laser body which is to be processed in accordance with the present invention may be any one of various commercially available semiconductor lasers such as ternary-compound semiconductor lasers of AlGaAs represented by semiconductor lasers capable of emitting light having wavelengths of 780 nm and 830 nm, quaternary-compound semiconductor lasers of GaInAsP, and other general semiconductor lasers.

The material of a masking layer for blocking or cutting off light emitted by the semiconductor laser is required to prevent almost all of the emitted light from passing through, i.e., to reflect or absorb almost all of the emitted light.

The masking layer material is also required to be removed or made optically transparent through thermally physical action, chemical reaction, melting, evaporation, or diffusion by exposure to the light emitted by the semiconductor laser.

Examples of the masking layer material include (1) metals such as Au, Cr, Ni, In, Zn, and Al and their compounds, (2) amphoteric metals such as $As_2Se_3$, Se, Te, and Sn and their compounds, and (3) carbon and S.

If the masking layer material used is not electrically insulative, then an electrically insulating layer such as of SiO, $SiO_2$, $As_2S_3$, $PbF_2$, $Al_2O_3$, $Si_3N_4$, $MgF_2$, $CeO_2$, $TiO_2$, and $CeS_3$ should be disposed between the light-emitting mirror surface of the semiconductor laser and the masking layer material.

Figure 1:
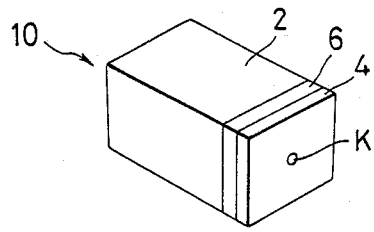
FIGS. 1 and 2 are perspective views of masked semiconductor lasers manufactured by the present invention.

FIG. 1 shows a masked semiconductor laser manufactured according to the present invention. The masked semiconductor laser, generally denoted at 10, includes a masking layer 4 and an electrically insulating layer 6 sandwiched between the masking layer 4 and a semiconductor laser body 2. The electrically insulating layer 6 is required to have a low refractive index since the light-emitting mirror surface of the semiconductor laser body 2, which lies in a crystal cleavage plane, also serves as a reflecting mirror surface for laser oscillation, and the reflecting characteristic of the reflecting mirror surface should be maintained. The electrically insulating layer 6 is also required to be optically transparent so that the mirror surface will not be destructed by light absorption. The material of the electrically insulating layer is applied to the light-emitting mirror surface of the semiconductor laser body 2 by any of various generally known processes such as vacuum evaporation, sputtering, and coating.

Where the masking material used that meets the various requirements described above is electrically insulative, the masking layer 4 is directly disposed on the light-emitting mirror surface of the semiconductor laser body 2.

After the masking layer 4 or the masking layer 4 and the electrically insulating layer 6 have been formed, a light-emitting hole of a very small area is defined in the masking layer 4 by light emitted by the semiconductor laser body 2 itself.

Figure 3:
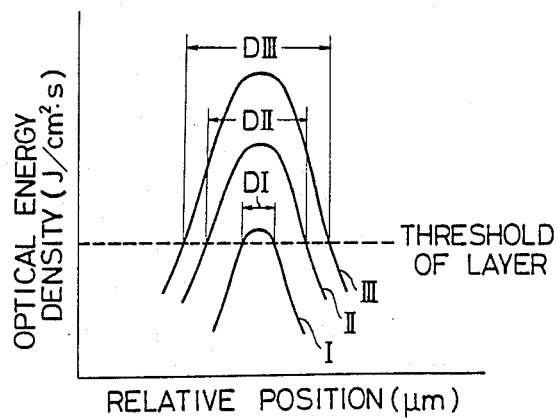
FIG. 3 is a graph explaining the manner in which the diameter of a light-emitting hole defined in a masking layer varies dependent on the light output level according to the Gaussian distribution pattern.

Since the intensity of light emitted by a semiconductor laser has a Gaussian distribution pattern, a light-emitting hole of a desired size having a small area can be defined by varying the output level of the emitted light in the vicinity of a "threshold of layer" at which the masking layer is removed or made opticaly transparent. FIG. 3 shows, by way of example, various diameters DI, DII, DIII of light-emitting holes dependent respectively on output levels I, II, III of the emitted light.

Figure 4:
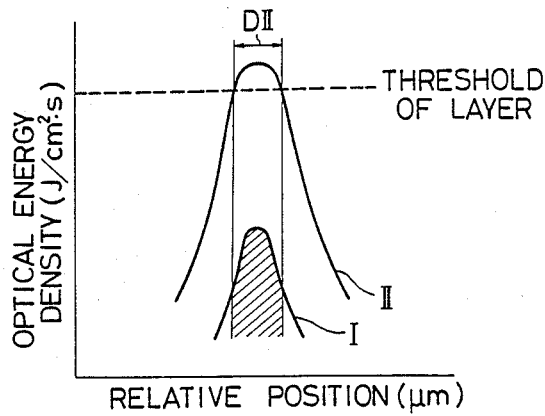
FIG. 4 is a graph explaining that no degradation occurs if a semiconductor laser is energized with a lower light output level than the light output level that is used when defining a light-emitting hole in a masking layer.

In order to keep the durability, particularly the size, of the light-emitting hole thus formed, it is generally preferable for the semiconductor laser, where it is employed as a light source for an optical memory, to emit a smaller light output than the output level of the light which was emitted to form the light-emitting hole. Where the light-emitting hole of the diameter II was defined by the light emitted at the output level II by the semiconductor laser body, as shown in FIG. 4, no degradation of the light-emitting hole will be experienced by energizing the semiconductor laser body to emit light at the output level I (rated output) which is lower than the "threshold of layer".

Experimental examples will be described below.

EXPERIMENTAL EXAMPLE 1

A masked semiconductor laser 10 constructed as shown in FIG. 1 was fabricated as follows:

A ternary-compound semiconductor laser of GaAs and AlGaAs (allowable light output: 5 mW, rated light output: 3 mW, and peak wavelength upon oscillation: 780 nm) was used as a semiconductor laser body 2. An electrically insulating layer 6 of SiO having a coating thickness of about 1500 Å was deposited on the light-emitting cleavage surface of the semiconductor laser body 2 by vacuum evaporation, under the following conditions:
Evaporation source material: SiO, purity 99.99% (manufactured by Furuuchi Chemical K.K.)
Evaporation source temperature: 1200° C.
Vacuum pressure: $2 \times 10^{-5}$ Torr
Temperature of the semiconductor laser body (substrate): 20°–42° C.

Then, a masking layer 4 of carbon having a coating thickness of about 800 Å was formed by sputtering on the electrically insulating layer 6 under the following conditions:
Target material: carbon, purity 99.99% (manufactured by Furuuchi Chemical K.K.)
Vacuum pressure: 0.05 Torr
Sputtering current: 5 mA/cm$^2$ Then, a light-emitting hole K was formed in the masking layer 4 by light emitted from the semiconductor laser body 2 itself. To confirm emitted output light that has passed through the light-emitting hole K, an optical power meter (model J6052+j16 manufactured by Tektronix) was placed in confronting relation to the surface of the masking layer 4, i.e., the light-emitting surface of the masked semiconductor laser, the optical power meter being spaced 2 mm from the masking layer 4. The semiconductor laser body 2 was energized to produce a light output of 5 mW. Although no external light output was recognized immediately after the energization of the semiconductor laser body 2, an external light output started to be confirmed 1 to 2 seconds later, and became stable a few seconds later. The stable external light output was 1.7 mW.

To check the size of the light-emitting hole K thus formed, a layer of Au having a coating thickness of about 200 Å was deposited on the light-emitting surface, and a scanning electron microscope was used to measure the dimensions of the hole K at the magnification of 20,000 times. The dimensions of the hole K were 0.2 micron×0.6 micron.

EXPERIMENTAL EXAMPLE 2

A masked semiconductor laser 10 constructed as shown in FIG. 1 was fabricated as follows:

A quaternary-compound semiconductor laser of InP and InGaAsP (allowable light output: 5 mW, rated light output: 3 mW, and peak wavelength upon oscillation: 1300 nm) was used as a semiconductor laser body 2. An electrically insulating layer 6 of SiO$_2$ having a coating thickness of about 1600 Å was deposited on the light-emitting cleavage surface of the semiconductor laser body 2 by vacuum evaporation, under the following conditions:
Evaporation source material: SiO$_2$, purity 99.99% (manufactured by Furuuchi Chemical K.K.)
Evaporation source temperature: 1600° C.
Vacuum pressure: $1 \times 10^{-5} - 2 \times 10^{-5}$ Torr
Temperature of the semiconductor laser body (substrate): 40°–56° C.

Then, a masking layer 4 of Al having a coating thickness of about 800 Å was formed by sputtering on the electrically insulating layer 6 under the following conditions:
Target material: Al, purity 99.99% (manufactured by Furuuchi Chemical K.K.)
Vacuum pressure: 0.05 Torr
Rare gas: Ar
Sputtering current: 7 mA/cm$^2$ Then, a light-emitting hole K was formed in the masking layer 4 by light emitted from the semiconductor laser body 2 itself. To confirm emitted output light that has passed through the light-emitting hole K, a germanium photodiode (model B2542-01 manufactured by Hamamatsu Photonix) was placed in confronting relation to the surface of the masking layer 4, i.e., the light-emitting surface of the masked semiconductor laser, the photodiode being spaced 2 mm from the masking layer 4. The semiconductor laser body 2 was energized to produce a light output of 5 mW. Although no external light output was recognized immediately after the energization of the semiconductor laser body 2, an external light output started to be confirmed 2 seconds later, and became stable a few seconds later. The stable external light output was 1.2 mW.

To check the size of the light-emitting hole K thus formed, a layer of Au having a coating thickness of about 200 Å was deposited on the light-emitting surface, and a scanning electron microscope was used to measure the dimensions of the hole K at the magnification of 20,000 times. The dimensions of the hole K were 0.2 micron×0.9 micron.

Figure 2:
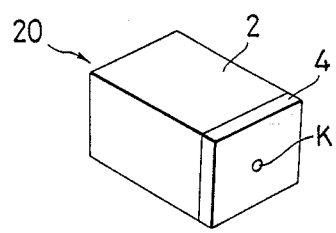

A masked semiconductor laser 20 of the type shown in FIG. 2 can also be fabricated using an electrically insulative masking material in a manner similar to that of the above experimental examples.

According to the method of the present invention, a masked semiconductor laser can be manufactured simply by depositing a masking layer and then energizing a semiconductor laser body at a suitable light output level. Since a light-emitting hole K is defined in the masking layer by output light emitted from the semiconductor laser body itself, the light-emitting hole is automatically aligned with an area of the semiconductor laser body where the intensity of the emitted light is highest without requiring optical axis alignment which would be needed if a masking layer were combined with the semiconductor laser body by an external means. Therefore, a light-emitting hole of an extremely small size can be formed.

Where a masked semiconductor laser manufactured by the present invention is employed as a light source for use with an optical memory or a magnetooptic memory, information can be recorded in the memory and reproduced from the memory at high packing density by keeping the storage medium or the memory spaced from the light-emitting surface of the semiconductor laser at a distance which is twice or less the wavelength of the light emitted from the semiconductor laser. A masked semiconductor laser fabricated according to the present invention may also be used as a spot light source for observing or measuring an object itself or the amount of movement of the object by applying a diverging portion of a divergent light beam emitted from the spot light source to the object and observing either a real image of the object enlarged by transmitted or reflected light or a shadow-picture-like diffraction pattern of the object.

Another embodiment of the present invention will be described below.

According to this embodiment, a light-shielding mask, i.e., a mask capable of blocking an emitted laser beam, is formed on a light-emitting end surface of a laser diode (LD), and the laser diode is energized in an evacuated vacuum container to emit a laser beam which removes a localized area of the mask to form a pinhole-like light-emitting hole in the mask.

More specifically, the vacuum developed in the vacuum container is of a pressure of $10^-$ Torr or lower, e.g., in the range of from $10^{-1}$ to $10^{-7}$ Torr. The light-emitting hole is formed by applying the heat energy of the laser beam emitted from the diode laser to the mask to evaporate away its localized area.

The laser diode that can be used may be a ternary-compound laser diode of AlGaAs represented by commercially available semiconductor lasers capable of emitting light having wavelengths of 780 nm and 830 nm.

The mask may be formed of an electrically insulative material and deposited as a single masking layer on the light-emitting surface of the laser diode, or may be formed of an electrically non-insulative material and combined with an insulating layer in a double-layer structure.

The material of the masking layer is generally required to prevent the laser beam emitted by the laser diode from passing therethrough, and to be melted or evaporated by the heat energy of the emitted laser beam. Materials which meet the above requirements include metals such as Au, Ag, Cr, In, Al and Zn and their compounds, amphoteric metals such as Se, Te, and Sn and their compounds, nonmetals such as carbon, S, Ge, and Si, and organic materials such as phthalocyanine dye and cyanine dye.

If the masking layer used is not electrically insulative, then the insulating layer which is electrically insulative is disposed between the light-emitting surface of the laser diode and the masking layer. Th insulating layer is required to be transparent to the laser beam emitted by the laser diode, and may be made of any of SiO, $SiO_2$, $Al_2O_3$, $Si_3N_4$, $MgF_2$, and $TiO_2$.

As described above, since the laser diode is energized within the vacuum container with a vacuum developed therein and the masking layer is evaporated by the heat energy of the light beam emitted by the laser diode, the masking laser material is evaporated at a higher rate than would be under normal pressure.

Various examples according to the other embodiment will be described below. In each of these examples, a (GaAl)As double-heterostructure semiconductor laser was used which has a maximum rated output of 5 mW, a continous output of 3 mW, and a laser beam wavelength of 780 nm.

EXAMPLE 1

A thin film of SiO having a coating thickness of 2100 Å was deposited as an insulating layer on the light-emitting surface, i.e., the cleavage surface, of the laser body by vacuum evaporation with the resitance-heated source, under the following conditions:
Evaporation source material: SiO, purity 99.99%
Evaporation source temperature: 1200° C.
Evaporation boat source: molybdenum
Vacuum pressure: $2 \times 10^{-5}$ Torr
Laser surface temperature: 20°–40° C.

On the insulating layer thus formed, a masking layer of Zn having a coating thickness of 2000 Å was deposited by evaporation with the resistance-heated source, under the following conditions:
Evaporation source material: Zn, purity 99.99%
Evaporation source temperature: 700° C.
Evaporation boat source: molybdenum
Vacuum pressure: $2 \times 10^{-5}$ Torr
Laser surface temperature: 20°–40° C.

The combination of the laser body, the insulating layer, and the masking layer will hereafter be referred to as a "blank".

The blank was placed in a vacuum chamber evacuated to a vacuum pressure of $1 \times 10^{-5}$ Torr therein, and the laser body was energized while the current being monitored. When the injected current was 50 mA, the monitored current was abruptly changed, indicating the possible formation of a light-emitting hole in the masking layer. Observation by an electron microscope at the magnification of 15,000 times confirmed the formation of a light-emitting hole having dimensions of 1.0 micron × 1.3 micron.

For comparison, the same blank was energized in atmosphere to form a light-emitting hole in the masking layer, which was defined at dimensions of 1.0 micron × 1.2 micron by an injected current of 73 mA.

EXAMPLE 2

An insulating layer of SiO having a coating thickness of 2100 Å was formed on the same laser body as above under the same conditions as those of EXAMPLE 1, and then a masking layer of Ti having a coating thickness of 1500 Å was deposited by evaporation with the resistance-heated source, under the following conditions:
Evaporation source material: Ti, purity 99.99%
Evaporation source temperature: up to 2000° C.
Evaporation boat source: tungsten
Vacuum pressure: $2 \times 10^{-5}$ Torr
Laser surface temperature: 20°–40° C.

The blank was placed in a vacuum chamber evacuated to a vacuum pressure of $1 \times 10^{-5}$ Torr, and the laser body was energized while the current being monitored. When the injected current was 98 mA, the monitored current was abruptly changed, indicating the possible formation of a light-emitting hole in the masking layer. Observation by an electron microscope at the magnification of 15,000 times confirmed the formation of a light-emitting hole having dimensions of 0.8 micron × 0.9 micron.

For comparison, the same blank was energized in atmosphere to form a light-emitting hole in the masking layer, but no light-emitting hole was formed.

EXAMPLE 3

An insulating layer of SiO having a coating thickness of 2100 Å was formed on the same laser body as above under the same conditions as those of EXAMPLE 1. Then, a masking layer of Ge having a coating thickness of 3500 Å was deposited by evaporation with the resistance-heated source, under the following conditions:
Evaporation source material: Ge, purity 99.99%
Evaporation source temperature: 1200° C.
Evaporation boat source: tungsten
Vacuum pressure: $1 \times 10^{-5}$ Torr
Laser surface temperature: 20°–40° C.

The blank was placed in a vacuum chamber evacuated to a vacuum pressure of $1 \times 10^{-5}$ Torr, and the laser body was energized while the current being monitored. When the injected current was 67 mA, the monitored current was abruptly changed, indicating the possible formation of a light-emitting hole in the masking layer. Observation by an electron microscope at the magnification of 15,000 times confirmed the formation of a circular light-emitting hole having a diameter of 0.9 micron.

For comparison, the same blank was energized in atmosphere to form a light-emitting hole in the masking layer, which was formed as a circular hole of a diameter of 1.0 micron by an injected current of 82 mA.

EXAMPLE 4

An insulating layer of SiO having a coating thickness of 2100 Å was formed on the same laser body as above under the same conditions as those of EXAMPLE 1. Then, a masking layer of an Au-Ge alloy (the ratio by weight of Au to Ge was 50:50) having a coating thickness of 4000 Å was deposited by evaporation with the resistance-heated source, under the following conditions:
Evaporation source material: Au-Ge alloy, purity 99.99%
Evaporation source temperature: 1200° C.
Evaporation boat source: tungsten
Vacuum pressure: $1 \times 10^{-5}$ Torr
Laser surface temperature: 20°–40° C.

The blank was placed in a vacuum chamber evacuated to a vacuum pressure of $1 \times 10^{-5}$ Torr, and the laser body was energized while the current being monitored. When the injected current was 83 mA, the monitored current was abruptly changed, indicating the possible formation of a light-emitting hole in the masking layer. Observation by an electron microscope at the magnification of 10,000 times confirmed the formation of a circular light-emitting hole having a diameter of 0.8 micron.

For comparison, the same blank was energized in atmosphere to form a light-emitting hole in the masking layer, which was formed as a circular hole of a diameter of 0.8 micron by an injected current of 98 mA.

Although certain preferred embodiments have been shown and described, it should be understood that many changes and modifications ma be made therein without departing from the scope of the appended claims.

What is claimed is:

1. A method of manufacturing a masked semiconductor laser, comprising the steps of:
    forming a masking layer capable of cutting off light emitted from a semiconductor laser body on a light-emitting surface of the semiconductor laser body; and
    thereafter, removing or making optically transparent a localized portion of said masking layer with light emitted from the semiconductor laser body for thereby defining a light-emitting hole in said masking layer for passage of said light therethrough, wherein said intensity of the light emitted from said semiconductor laser body is adjusted such that the energy of the light is higher than a threshold at which said masking layer is removed or made optically transparent is collected in an area of said light-emitting surface within the diameter of said light-emitting hole, and wherein said semiconductor laser body is energized in an evacuated vacuum chamber to emit light for forming said light-emitting hole.

2. A method according to claim 1, wherein said semiconductor laser body comprises a semiconductor laser capable of emitting light having a wavelength of 780 nm or 830 nm.

3. A method according to claim 2, wherein said semiconductor laser comprises one of a ternary-compound semiconductor laser of AlGaAs and a quaternary-compound semiconductor laser of GaInAsP.

4. A method according to claim 1, wherein said masking layer is formed of a material capable of cutting off the light emitted from said semiconductor laser body and of being removed or made optically transparent by exposure to the light emitted from said semiconductor laser body.

5. A method according to claim 4, wherein said material of the masking layer is removed or made optically transparent through thermally physical action, chemical reaction, melting, evaporation, or diffusion.

6. A method according to claim 5, wherein said material of the masking layer is selected from the group consisting of Au, Cr, Ni, In, Zn, and Al and their compounds, $As_2Se_3$, Se, Te, and Sn and their compounds, carbon, and S.

7. A method according to claim 1, 4, 5, or 6, wherein, if said masking layer is not electrically insulative, an electrically insulating layer which is optically transparent and has a low refractive index is disposed between the light-emitting surface of the semiconductor laser body and said masking layer.

8. A method according to claim 7, wherein said electrically insulating layer is made of a material selected from the group consisting of SiO, $SiO_2$, $As_2S_3$, $PbF_2$, $Al_2O_3$, $Si_3N_4$, $MgF_2$, $CeO_2$, $TiO_2$, and $CeS_3$.

9. A method according to claim 7, wherein said light-emitting surface of the semiconductor laser body on which said masking layer is formed lies on a crystal cleavage plane of said semiconductor laser body.

10. A method according to claim 1, 6, or 8, wherein said masking layer or said electrically insulating layer is formed by one of vacuum evaporation, sputtering, and coating.

11. A method according to claim 1, wherein said light emitted from the semiconductor laser body has an intensity having a Gaussian distribution pattern.

12. A method according to claim 10, wherein a ternary-compound semiconductor laser of GaAs and AlGaAs (allowable light output: 5 mW, rated light output: 3 mW, and peak wavelength upon oscillation: 780 nm) is used as said semiconductor laser body, an electrically insulating layer of SiO having a coating thickness of about 1500 Å is deposited on the light-emitting cleavage surface of the semiconductor laser body by vacuum evaporation, then a masking layer of carbon having a coating thickness of about 800 Å was formed by sputtering on the electrically insulating layer, and thereafter a light-emitting hole is formed in the masking layer by light emitted from the semiconductor laser body itself.

13. A method according to claim 12, wherein said electrically insulating layer is deposited under the conditions:
Evaporation source material: SiO, purity 99.99% (manufactured by Furuuchi Chemical K.K.)
Evaporation source temperature: 1200° C.
Vacuum pressure: $2 \times 10^{-5}$ Torr
Temperature of the semiconductor laser body (substrate): 20°–42° C.
and said masking layer is formed under the conditions:
Target material: carbon, purity 99.99% (manufactured by Furuuchi Chemical K.K.)
Vacuum pressure: 0.05 Torr
Sputtering current: 5 mA/cm$^2$.

14. A method according to claim 10, wherein a quaternary-compound semiconductor laser of InP and InGaAsP (allowable light output: 5 mW, rated light output: 3 mW, and peak wavelength upon oscillation: 1300 nm) is used as said semiconductor laser body, an electrically insulating layer of SiO$_2$ having a coating thickness of about 1600 Å is deposited on the light-emitting cleavage surface of the semiconductor laser body by vacuum evaporation, and then a masking layer of Al having a coating thickness of about 800 Å is formed by sputtering on the electrically insulating layer, and thereafter a light-emitting hole is formed in the masking layer by light emitted from the semiconductor laser body itself.

15. A method according to claim 14, wherein said electrically insulating layer is deposited under the conditions:
Evaporation source material: SiO$_2$, purity 99.99% (manufactured by Furuuchi Chemical K.K.)
Evaporation source temperature: 1680° C.
Vacuum pressure: $1 \times 10^{-5}$–$2 \times 10^{-5}$ Torr
Temperature of the semiconductor laser body (substrate): 40°–56° C.
and said masking layer is formed under the conditions:
Target material: Al, purity 99.99% (manufactured by Furuuchi Chemical K.K.)
Vacuum pressure: 0.05 Torr
Rare gas: Ar
Sputtering current: 7 mA/cm$^2$.

16. A method according to claim 1, wherein means for detecting the light emitted from said semiconductor laser body is disposed in confronting relation to a surface of said masking layer.

17. A method according to claim 16, wherein said means comprises an optical power meter or a germanium photodiode.

18. A method according to claim 1, wherein said vacuum chamber is evacuated to a pressure of $10^{-1}$ Torr or lower.

19. A method according to claim 1, wherein said vacuum chamber is evacuated to a pressure ranging from $10^{-1}$ Torr to $10^{-7}$ Torr.

20. A method according to claim 1, wherein said said semiconductor laser body comprises a semiconductor laser capable of emitting light having a wavelength of 780 nm or 830 nm.

21. A method according to claim 20, wherein said semiconductor laser comprises a ternary-compound semiconductor laser of AlGaAs.

22. A method according to claim 1, wherein said masking layer is formed as a single layer or has a double-layer structure comprising an electrically noninsulative layer and an insulating layer.

23. A method according to claim 1, wherein said masking layer is formed of a material capable of cutting off the light emitted from said semiconductor laser body and of being melted or evaporated by heat energy of the light emitted from said semiconductor laser body.

24. A method according to claim 23, wherein said material of the masking layer is selected from the group consisting of Au, Ag, Cr, In, Al and Zn and their compounds, Se, Te, and Sn and their compounds, carbon, S, Ge, and Si, and phthalocyanine dye and cyanine dye.

25. A method according to claim 22, wherein said insulating layer is electrically insulative and disposed between the light-emitting surface of the semiconductor laser body and the masking layer.

26. A method according to claim 25, wherein said insulating layer is transparent to the light emitted from the semiconductor laser body.

27. A method according to claim 26, wherein said insulating layer is made of a material selected from the group consisting of SiO, SiO$_2$, Al$_2$O$_3$, Si$_3$N$_4$, MgF$_2$, and TiO$_2$.

28. A method according to claim 22, wherein a (GaAl)As double-heterostructure semiconductor laser is used as the semiconductor laser body (which has a maximum rated output of 5 mW, a continous output of 3 mW, and a laser beam wavelength of 780 nm), a thin film of SiO having a coating thickness of 2100 Å is deposited as the insulating layer on a light-emitting cleavage surface of said semiconductor laser by evaporation, and a masking layer is formed on said insulating layer by evaporation.

29. A method according to claim 28, wherein said insulating layer is deposited under the conditions:
Evaporation source material: SiO, purity 99.99%
Evaporation source temperature: 1200° C.
Evaporation boat source: molybdenum
Vacuum pressure: $2 \times 10^{-5}$ Torr
Laser surface temperature: 20°–40° C. and said masking layer is formed under the conditions:
Evaporation source material: Zn, purity 99.99%
Evaporation source temperature: 700° C.
Evaporation boat source: molybdenum
Vacuum pressure: $2 \times 10^{-5}$ Torr
Laser surface temperature: 20°–40° C.
Thickness of the masking layer: 2000 Å.

30. A method according to claim 29, wherein said semiconductor layer is energized in the vacuum chamber evacuated to a pressure of $1 \times 10^{-5}$ Torr to form the light-emitting hole.

31. A method according to claim 28, wherein said insulating layer is deposited under the conditions:
Evaporation source material: SiO, purity 99.99%
Evaporation source temperature: 1200° C.
Evaporation boat source: molybdenum
Vacuum pressure: $2 \times 10^{-5}$ Torr
Laser surface temperature: 20°–40° C. and said masking layer is formed under the conditions:
Evaporation source material: Ti, purity 99.99%
Evaporation source temperature: up to 2000° C.
Evaporation boat source: tungsten
Vacuum pressure: $2 \times 10^{-5}$ Torr
Laser surface temperature: 20°–40° C.
Thickness of the masking layer: 1500 Å.

32. A method according to claim 31, wherein aid semiconductor layer is energized in the vacuum chamber evacuated to a pressure of $1\times 10^{-5}$ Torr to form the light-emitting hole.

33. A method according to claim 28, wherein said insulating layer is deposited under the conditions:
Evaporation source material: SiO, purity 99.99%
Evaporation source temperature: 1200° C.
Evaporation boat source: molybdenum
Vacuum pressure: $2\times 10^{-5}$ Torr
Laser surface temperature: 20°–40° C.
and said masking layer is formed under the conditions:
Evaporation source material: Ge, purity 99.99%
Evaporation source temperature: 1200° C.
Evaporation boat source: tungsten
Vacuum pressure: $1\times 10^{-5}$ Torr
Laser surface temperature: 20°–40° C.
Thickness of the masking layer: 3500 Å.

34. A method according to claim 33, wherein said semiconductor layer is energized in the vacuum chamber evacuated to a pressure of $1\times 10^{-5}$ Torr to form the light-emitting hole.

35. A method according to claim 28, wherein said insulating layer is deposited under the conditions:
Evaporation source material: SiO, purity 99.99%
Evaporation source temperature: 1200° C.
Evaporation boat source: molybdenum
Vacuum pressure: $2\times 10^{-5}$ Torr
Laser surface temperature: 20°–40° C.
and said masking layer is formed under the conditions:
Evaporation source material: Au-Ge alloy, purity 99.99%
Evaporation source temperature: 1200° C.
Evaporation boat source: tungsten
Vacuum pressure: $1\times 10^{-5}$ Torr
Laser surface temperature: 20°–40° C.
Thickness of the masking layer: 4000 Å
Ratio by weight of Au to Ge: 50:50.

36. A method according to claim 35, wherein said semiconductor layer is energized in the vacuum chamber evacuated to a pressure of $1\times 10^{-5}$ Torr to form the light-emitting hole.

* * * * *

UNITED STATES PATENT AND TRADEMARK OFFICE
CERTIFICATE OF CORRECTION

PATENT NO.    :   4,840,922
DATED         :   June 20, 1989
INVENTOR(S)   :   Hiroshi KOBAYASHI, et al It is certified that error appears in the above-identified patent and that said Letters Patent is hereby corrected as shown below:

On the Title Page, Item [22], the Filing Date is incorrect, it should read as follows:

--July 29, 1987--

Signed and Sealed this

Fifteenth Day of May, 1990

*Attest:*

HARRY F. MANBECK, JR.

*Attesting Officer*     *Commissioner of Patents and Trademarks*